United States Patent [19]

Thornton et al.

[11] 4,345,247

[45] Aug. 17, 1982

[54] DISPLAY SYSTEM FOR STEADY STATE WAVES

[76] Inventors: William E. Thornton; James F. Thornton, both of 701 Cowards Creek Rd., Friendswood, Tex. 77546

[21] Appl. No.: 191,398

[22] Filed: Sep. 29, 1980

[51] Int. Cl.³ ............................................. G09G 3/00
[52] U.S. Cl. ...................................... 340/755; 73/646; 179/1 MN; 324/96; 340/660; 340/753; 434/300
[58] Field of Search ............... 340/660, 662, 704, 755, 340/782, 753, 754; 324/96; 179/1 MN, 1 N; 434/300; 73/645, 646

[56] References Cited

U.S. PATENT DOCUMENTS

| | | | |
|---|---|---|---|
| 2,571,156 | 10/1951 | Nelson | 340/660 X |
| 3,480,912 | 11/1969 | Speeth et al. | 340/660 X |
| 3,796,951 | 3/1974 | Joseph | 340/782 X |
| 3,927,399 | 12/1975 | Fuzzell | 340/662 X |
| 3,952,247 | 4/1976 | Horichi | 324/96 X |
| 4,073,194 | 2/1978 | Willson et al. | 73/646 |

Primary Examiner—David L. Trafton
Attorney, Agent, or Firm—Keith D. Beecher

[57] ABSTRACT

A system for directly displaying steady state waves, such as sound waves, ultrasonic waves, electromagnetic waves, and the like, by instantaneously sampling the amplitude of the waves in a known phase relationship with some other portion of the wave train. The system includes a source of the waves, such as a speaker, and a transducer, such as a microphone, an electrical signal source being coupled to the wave signal source, and the transducer being connected to a sample and hold circuit whose output is applied to a light emitting diode (LED), or other display unit. The transducer is moved towards and away from the wave signal source in the path of the waves eminating from the wave signal source. In the following description the system will be described in conjunction with wound waves traveling in air, eminating from a speaker and transduced by a microphone. It will be evident as the description proceeds that the system may be used for displaying waves other than sound waves, such as ultrasonic waves; and/or for displaying waves traveling in a medium other than air.

9 Claims, 8 Drawing Figures

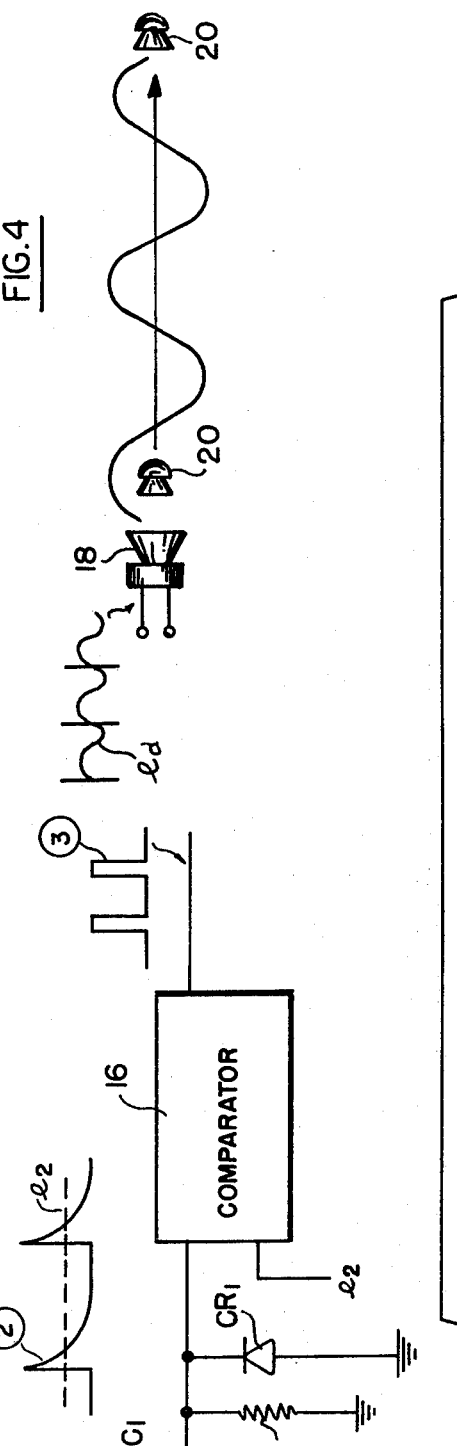
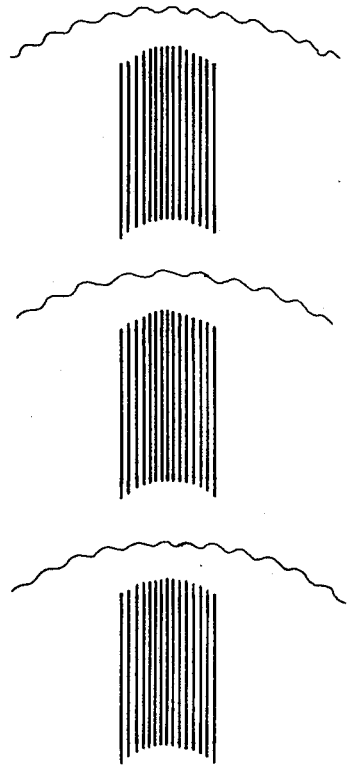
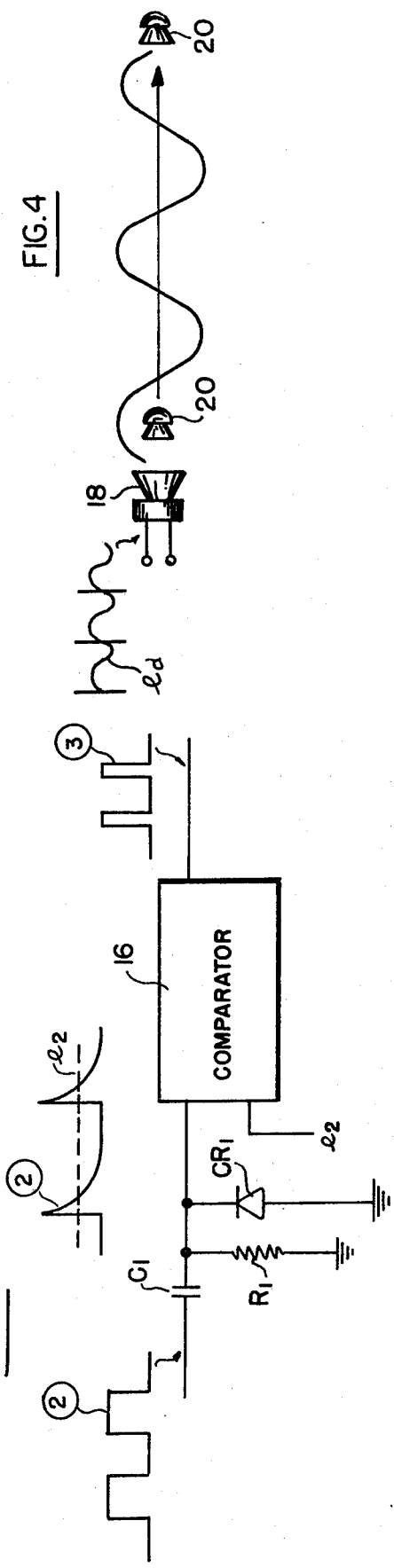

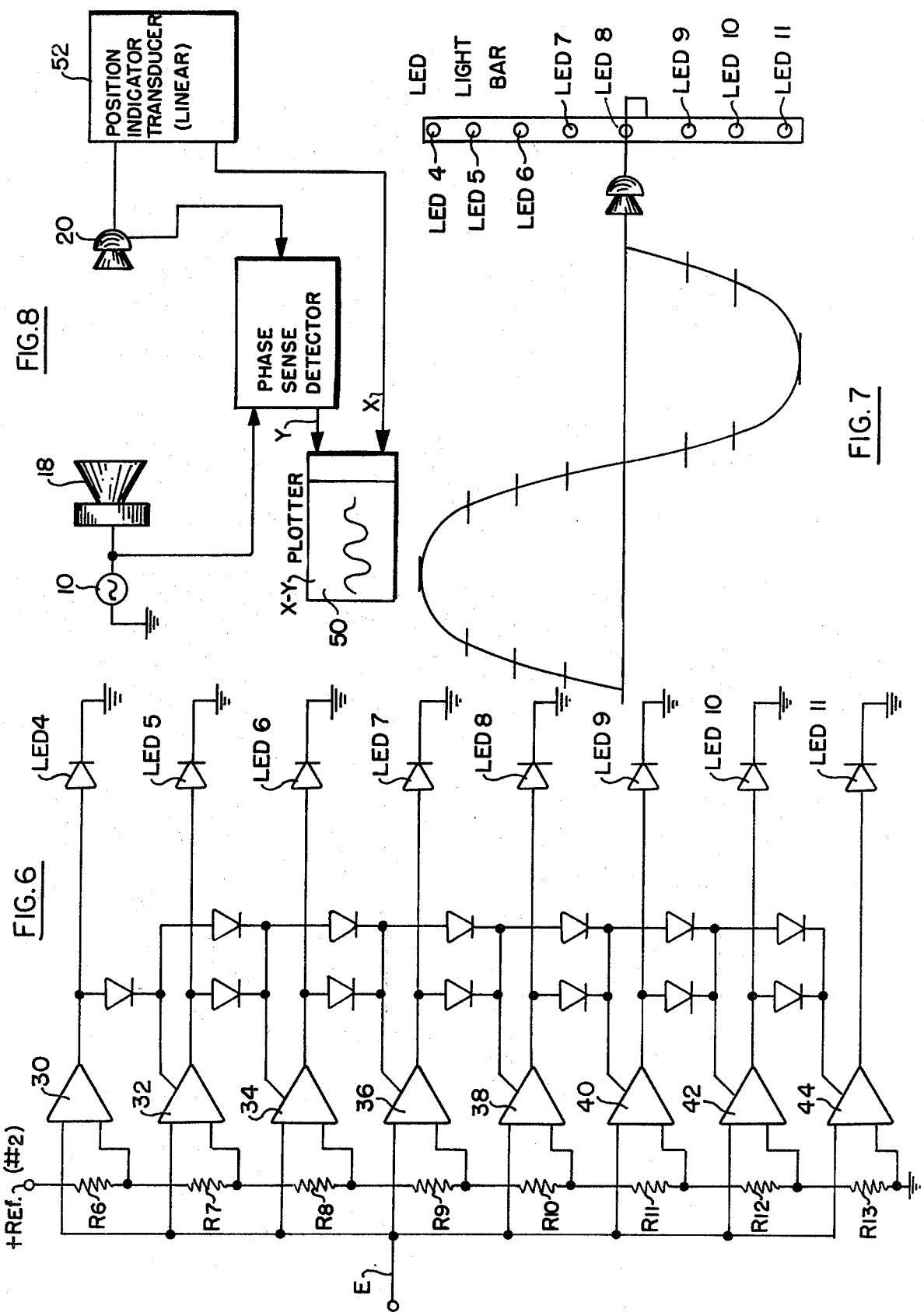

DISPLAY SYSTEM FOR STEADY STATE WAVES

BACKGROUND

Work has been conducted in the past in the Bell Telephone Laboratories and elsewhere on sound visualization, and the work has been described in a publication by Kock, entitled "Seeing Sound", Wiley & Sons 1971. Unlike the system of the present invention, the prior art system relies on a crude method of phase detection achieved by mixing the driving and received signals, and the prior system displays only the phase cancellation points of the two signals; and not the positive and negative amplitudes, as is the case with the system of the invention. The waves must be carefully chosen for amplitude in the prior system, or else very little cancellation results, and the system becomes inoperative. Moreover, the prior art system, unlike the system to be described, is incapable of deriving true waveforms.

BRIEF DESCRIPTION OF THE DRAWINGS

FIG. 3 is a circuit and block diagram of one of the components of the system of FIG. 1;

FIG. 4 is a schematic diagram showing movement of the sensing microphone included in the system of FIG. 1 along a particular axis with respect to a speaker, which is also included in the system;

FIG. 5 is a graphic representation of displays by light emitting diodes (LED's) including in the system of FIG. 1;

FIG. 6 is a circuit diagram of a light emitting diode (LED) display network;

FIG. 7 is a representation of a sound wave as established by a light emitting diode (LED) light bar; and FIG. 8 is a block diagram of a second embodiment of the system of the invention.

DETAILED DESCRIPTION OF THE ILLUSTRATED EMBODIMENT

Figure 2:
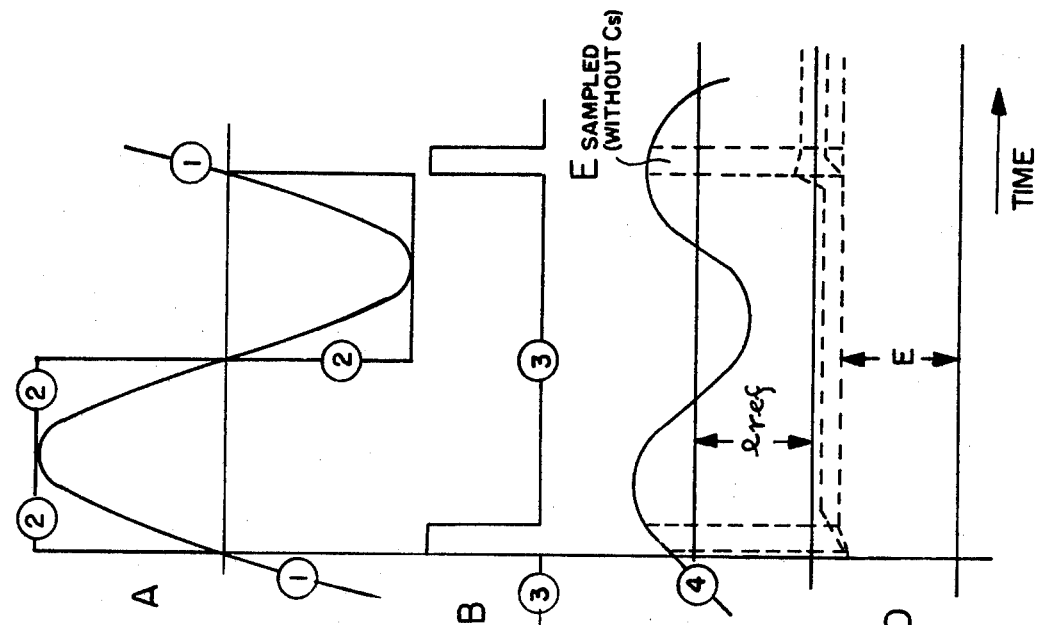
FIG. 2 is a series of waveforms, useful in explaining the operation of the system of FIG. 1.
Figure 1:
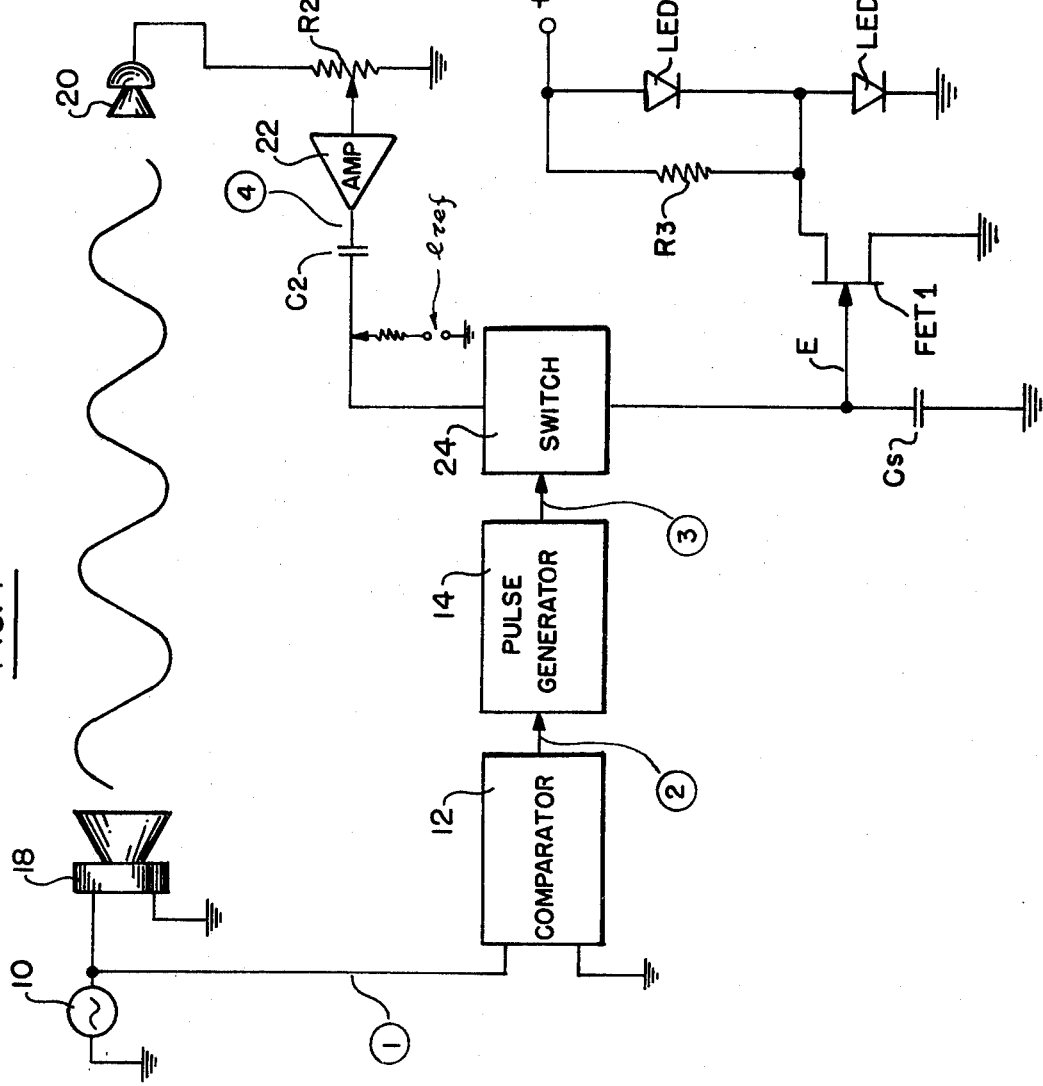
FIG. 1 is a schematic diagram of a system representing one embodiment of the invention.

In the system of FIG. 1, a driving voltage 1 (curve A FIG. 2) derived from an alternating current source 10 is applied to a comparator 12. The comparator is referenced to ground, and its output 2 (curve A FIG. 2) goes positive during the positive half-cycles of the driving voltage. The leading edge of the resulting waveform 2 (curve A FIG. 2) is used to trigger a pulse generator 14, causing the pulse generator to produce short sample pulses 3 (curve B FIG. 2).

The pulse generator 14 may, for example, be a one-shot; or the circuit of FIG. 3 may be used to generate the sampling pulses. The circuit of FIG. 3 includes a differentiating network made up of a capacitor C1 and a resistor R1, the differentiating network being connected to a comparator 16. A diode CR1 is connected across resistor R1. A DC voltage $e_2$ is applied to the other input of the comparator 16. The square wave 2 is transformed into the differentiated waveform 2A (FIG. 3) by the differentiating circuit, and the latter waveform causes the comparator 16 to produce the sampling pulses 3. Each sampling pulse 3 has a relatively short duration, for example, of about 4 microseconds, and the sampling pulses are phase locked with the driving signal 1.

The driving voltage 1 is also applied to a speaker 18 (FIG. 1). The driving signal has a frequency in the audio range and, accordingly, the speaker 18 produces a sound signal. A small microphone 20 is placed a selected distance from the speaker, and the microphone transforms the received sound wave into a corresponding audio signal. The resulting audio signal, which appears across a potentiometer R2 is raised to several volts by a conventional low distortion audio amplifier 22. The resulting signal 4 (curve C of FIG. 2) is applied to a fast acting semiconductor switch 24 through a coupling capacitor C2.

Switch 24 is closed by each sampling pulse 3 from pulse generator 14, and the resulting sampled portion of voltage 4 charges capacitor $C_S$ to the level of that portion of the amplified audio signal. The voltage level across capacitor $C_S$ is maintained between sampling intervals. Thus the voltage across capacitor $C_S$ represents the instantaneous amplitude of the sound wave at the sampling intervals.

The voltage across capacitor $C_S$ is applied to the gate of a field effect transistor FET1. The field effect transistor being used to drive a pair of light emitting diodes designated LED1 and LED2. The light emitting diodes are connected between a positive voltage source and ground. The light emitting diode LED1 is shunted by a resistor R3. It is necessary to apply a bias voltage $e_{ref}$ to voltage 4 so that the field effect transistor FET1 will always draw current.

A variety of display systems are available based on the phase sensitive amplitude detector of FIG. 1, the detector producing a voltage level proportional to the instantaneous amplitude of the sound wave emitted by speaker 18.

If the sound source (represented by speaker 18) is positioned at a selected point, and if the sensing microphone 20 is progressively moved along a selected axis, the varying voltage level developed by the system of FIG. 1 will be proportional to the sound wave amplitude, as represented by the diagram of FIG. 4. The sampling is essentially instantaneous, and it is locked to zero phase of the driving signal from source 10. While the driving signal 1 may be of any frequency or shape, so long as its period is long compared to the sample period, its frequency must not vary since several cycles may elapse before sampling occurs. In the example of FIG. 4, the actual sample signal is generated approximately two cycles before the reference waveform. The signal applied to the comparator 12, may, if so desired be derived from a second microphone positioned in front of speaker 18, where the driving voltage for speaker 18 (i.e. source 10) is not accessible.

The simplest display scheme is a voltmeter connected across the load R3 of the field effect transistor FET1 and ground, with the light emitting diodes LED1 and LED2 removed. Voltage indicated by the voltmeter represents instantaneous amplitude. If microphone 20 is moved toward speaker 18 and amplitude plotted with respect to distances, a waveform will result. As noted, there is no restriction on the waveform, so long that it is cyclic and has a constant frequency.

A more graphic but less precise display uses light emitting diodes whose illumination is proportional to the voltage at the gate of the field effect transistor FET1. If one makes a single sweep with microphone 20 along the axis with respect to speaker 18 there will be alternating light and dark segments along the path, as shown in FIG. 5A. Multiple paths may be made and photographed such that the sound waves are visualized, as shown in FIG. 5B. An even more graphic display is to use one color light emitting diode (LED 1) in series with the field effect transistor FET1 and in parallel with the field effect transistor load R3. A second light emitting diode (LED 2) of a different color is placed across the field effect transistor load R3 to ground.

If the one of the light emitting diodes in series with FET 1 is, for example, green, and the other light emitting diode in parallel with FET 1 is, for example, red, the illumination of the green field effect transistor increases on positive portion of the cycle and decreases on negative portion, whereas the intensity of the red light emitting diode increases on the negative portion of the cycle and decreases on the positive portion. The bias is adjusted so that the green LED is extinguished on the negative portion of the cycle, and the red LED is extinguished on the positive portion of the cycle. With multiple sweeps, one now has alternating bands of red and green lights corresponding to the positive and negative parts of the cycle. This display will show wavelength and phase and indicate reduced amplitude with distance.

By replacing the field effect transistor FET1 in FIG. 1 with a comparator string, as shown in FIG. 6, amplitude is now displayed as height along a vertical axis. The circuit of FIG. 6 operates as follows. The reference voltage, which is different from $e_{ref}$ in FIG. 1, is divided by the resistor string R6–R13 such that each comparator 30, 32, 34, 36, 38, 40, 42 and 44 from the bottom to the top responds to an increasingly higher detector voltage E. In addition, the comparators may have an internal gate, as indicated which is turned off by an output from any comparator higher in the string which is in its on state. A series of diodes is connected, as shown, the diodes being assumed to be idealized with zero forward drop. In practice, if a very large string of comparators were used, then some added diodes would be required. The result of the diode gating is that only the comparator at the highest amplitude powers its associated light emitting diode of the group designated LED4–LED11. If one now attaches a vertical bar, with the light emitting diodes LED4–LED10 in order to the detection microphone 20, and moves the microphone at right-angles to the wave front the wave shape will be traced as indicated in FIG. 7.

The display could be traced directly on paper. One could also connect a usual type of X,Y recorder 50 to the detector system of FIG. 1, as shown in FIG. 6, and obtain precision plate by connecting a linear position transducer 52 into the circuit, as also shown in FIG. 8.

The invention provides, therefore, an improved and simplified system for displaying steady state waves. The system finds primary use as a teaching aid, for example, as a hands-on museum display. However, the system of the invention is potentially applicable to any area in the study of sound or pressure waves, for example, in high fidelity systems, acoustical systems, and the like.

As mentioned above, although the system has been described in conjunction with sound waves, it has broader application for the display of any wave phenomena. For example, the system may be used to display compression waves in water by the use of appropriate transducers; or to display recurring shock waves in solids, and so on. Likewise, the system may be used to display ultrasonic waves. For example, if the behavior of ultrasonic waves in a solid is to be displayed, a probe transducer may be used and coupled by a motion transducer to an X-Y plotter. Gains may be adjusted in the latter system, and the only limits are mechanical size and the speed of the sampling circuits. Sampling circuits are available in the nanosecond region and even into the picosecond region. The system of the invention may also be used to display electromagnetic waves by using suitable electromotive or electromagnetic probes. Magnification of the display can be achieved by increasing the plotted size with respect to the detected size. For example, a 1 mm movement or scan could produce 1 volt in a motion (X) transducer, and this is more than enough to drive a one meter scale.

It will be appreciated, therefore, that although particular embodiments of the invention have been shown and described, modifications may be made. It is intended in the claims to cover the modifications which come within the spirit and scope of the invention.

What is claimed is:

1. A system for visually displaying a steady state cyclic wave comprising: a source for producing a cyclic electrical signal; first transducer means coupled to said source to be driven by said electrical signal for propagating a cyclic wave along a particular path in a selected medium; a second transducer means positioned in the path of said wave and movable along the path towards and away from the first transducer means; said second transducer means serving to convert the cyclic wave into a corresponding cyclic electrical signal; sample and hold circuit means coupled to the second transducer means for producing a voltage representing the instantaneous amplitude of the wave at a sampled point in each cycle thereof; circuitry connected to said source for producing sampling pulses for said sample and hold circuit means having a predetermined fixed phase relationship with the cyclic electrical signal from said source; electrically energized display means; and drive circuit means connected to the sample and hold circuit means for producing a drive signal for the display means corresponding to the voltage produced by the circuit means.

2. The system defined in claim 1, in which said first transducer means is a speaker, said cyclic wave is a sound wave, and said second transducer means is a microphone.

3. The system defined in claim 1, in which said electrically energized display means comprises at least one light emitting diode.

4. The system defined in claim 3, and which includes a first light emitting diode of one color and a second light emitting diode of a second color, and means connecting the drive circuit means to the two light emitting diodes so that one is illuminated on positive half-cycles of the cyclic wave and the other is illuminated on negative half-cycles of the cyclic wave.

5. The system defined in claim 3, in which said drive circuit means includes a string of comparators and a corresponding string of light emitting diodes respectively connected thereto so that different ones of the light emitting diodes are illuminated as the cyclic wave passes through each complete cycle.

6. The system defined in claim 5, in which said cyclic wave is a sound wave and said second transducer means is a microphone and in which the light emitting diodes are mounted in a bar attached to the microphone and extending at right angles to the path.

7. The system defined in claim 1, in which said display means comprises an X-Y plotter connected to said circuit means for plotting the waveform of the cyclic wave.

8. The system defined in claim 7, in which said plotter plots the waveform on a scale different from the detected amplitude of the waveform.

9. The system defined in claim 1, in which said cyclic wave is an electromagnetic wave.

* * * * *